United States Patent
Lin

(10) Patent No.: US 10,088,753 B1
(45) Date of Patent: Oct. 2, 2018

(54) RECONFIGURING IMAGE BRIGHTNESS MODULE AND RELATED METHOD

(71) Applicant: Powerchip Technology Corporation, Hsinchu (TW)

(72) Inventor: Chun-Liang Lin, Hsinchu (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 15/667,613

(22) Filed: Aug. 2, 2017

(30) Foreign Application Priority Data

May 17, 2017 (TW) .............................. 106116207 A

(51) Int. Cl.
   G03B 27/68  (2006.01)
   G03F 7/20   (2006.01)
   G02B 26/08  (2006.01)
   G02B 13/16  (2006.01)

(52) U.S. Cl.
   CPC ......... *G03F 7/70133* (2013.01); *G02B 13/16* (2013.01); *G02B 26/0833* (2013.01)

(58) Field of Classification Search
   CPC .. G03F 7/70133; G02B 13/16; G02B 26/0833
   See application file for complete search history.

(56) References Cited

U.S. PATENT DOCUMENTS

| | | | |
|---|---|---|---|
| 6,193,393 B1 * | 2/2001 | Dove .................. | G02B 27/141 362/19 |
| 6,927,886 B2 | 8/2005 | Plesniak | |
| 8,717,484 B2 * | 5/2014 | McMackin ............ | H04N 5/335 348/337 |
| 8,760,542 B2 * | 6/2014 | Bridge ................. | H04N 5/2351 348/227.1 |
| 9,160,914 B2 * | 10/2015 | Bridge .................. | H04N 5/232 |
| 9,195,122 B2 * | 11/2015 | Dewald ................ | G02B 27/145 |
| 9,323,161 B2 | 4/2016 | Granik | |
| 9,325,947 B2 * | 4/2016 | Bridge .................. | H04N 5/232 |
| 9,479,787 B2 * | 10/2016 | Sato ..................... | H04N 19/172 |
| 9,488,444 B2 * | 11/2016 | Streuber ............... | F41G 7/008 |
| 9,528,819 B2 | 12/2016 | Herschbach | |
| 9,671,281 B2 * | 6/2017 | Wieners .................. | G01J 1/42 |
| 2006/0239336 A1 * | 10/2006 | Baraniuk ................ | H04L 25/20 375/216 |
| 2008/0062389 A1 * | 3/2008 | Sandstrom ............. | G03B 27/44 355/46 |

(Continued)

*Primary Examiner* — Deoram Persaud
(74) *Attorney, Agent, or Firm* — Winston Hsu

(57) ABSTRACT

A reconfiguring image brightness (RIB) module includes a switch, a first lens, a digital micro-mirror device (DMD), a second lens and a third lens. The switch selectively allows a first image having a light intensity distribution to pass, wherein the first image is formed after an illumination beam passes through a photomask. The first lens outputs a second image by modulating the size of the first image passes through the first lens, and the second image is imaged on the DMD. A third image having a reconfigured light intensity distribution is formed by the DMD, and the third image is outputted to the second lens by the DMD. A fourth image is formed after the third image passes through the second lens, a fifth image is formed after the fourth image passes through the third lens and the fifth image is outputted from the RIB module.

20 Claims, 7 Drawing Sheets

(56) References Cited

U.S. PATENT DOCUMENTS

| | | | |
|---|---|---|---|
| 2008/0198350 A1* | 8/2008 | Sugita | G03F 7/70091 355/46 |
| 2012/0038786 A1* | 2/2012 | Kelly | G02B 26/0833 348/222.1 |
| 2012/0038805 A1* | 2/2012 | Kelly | G02B 26/0833 348/300 |
| 2013/0083312 A1* | 4/2013 | Baraniuk | G01J 3/2823 356/51 |

* cited by examiner

RECONFIGURING IMAGE BRIGHTNESS MODULE AND RELATED METHOD

BACKGROUND OF THE INVENTION

1. Field of the Invention

The present invention relates to a reconfiguring image brightness module and related method, more particularly, to a reconfiguring image brightness module and related method capable of reducing the lithography hotspots in the device layout.

2. Description of the Prior Art

Generally, fabricating a semiconductor device requires complex semiconductor fabrication processes, where various circuit layouts on the chip need to be defined by multiple photolithography processes. With the designers and manufacturers continuously increasing the numbers of the circuit elements in each unit area and decreasing the sizes of the circuit elements, the patterns for the circuit elements formed on a substrate are getting smaller and smaller as well as closer and closer to one another. In recent years, the photolithography process has progressed to micro-photolithography process, in which the minimum size of an opening on the photomask has been reduced to about ten times the wavelength of the light source. The shrinkage of the dimension of the circuit elements makes it harder and harder to fabricate the desirable layout patterns on the substrate. The partial reason is that diffraction of light may generate defects during the photolithography process so that the desirable images fail to be precisely formed on the substrate, and the defects further form in the final element structures. In addition, the exposure in the photolithography process is basically performed by the single exposure, and the exposure sensitivity of different patterns in the photomask is different from each other during the exposure. For example, since the processing windows for patterns with different densities and different widths are different, a considerable effort is inevitably required to obtain a balanced exposure dose between different patterns to perform the photolithography process.

So far, resolution enhancement techniques (RETS) are used to improve the resolution of the patterns in the photolithography process in this field. For example, an optical proximity correction (OPC) adjusts the amplitude of light passing through a photomask to change the quality of the final image formed on a target. For example, the rim of a layout pattern is often adjusted by such techniques to enlarge or to shrink some geometric parts by estimating the overexposure or the underexposure of a certain point on a substrate to alter the critical dimension (CD) of a certain part. However, what is insufficient is that, some layout regions still have imaging problems in spite of the above resolution enhancement techniques. These problematic regions are known as hotspots in this industrial field. The issue of the hotspots can only be corrected by changing the original layout design to alter the profile of the final patterns. The amending flow can be done at the manufacturer's end or at the designer's end. However, the entire amending flow is time-consuming and expensive. Accordingly, the industrial field is still looking for a new technique which is capable of more efficiently reducing lithography hotspots and improving the accuracy of lithography.

SUMMARY OF THE INVENTION

It is therefore one of the objectives of the present invention to provide a reconfiguring image brightness module and related method for reducing the lithography hotspots in the device layout.

According to an embodiment of the present invention, a reconfiguring image brightness (RIB) module is provided. The RIB module includes a switch, a first lens, a digital micro-mirror device (DMD), a second lens, and a third lens. The switch selectively allows a first image having a light intensity distribution to pass, wherein the first image having the light intensity distribution is formed after an illumination beam passes through a photomask. The first lens outputs a second image by modulating a size of the first image that passes through the first lens. The second image is imaged on a surface of the DMD, and a third image having a reconfigured light intensity distribution is formed by the DMD. The third image is outputted to the second lens by the DMD, and the second lens outputs a fourth image by modulating a size of the third image that passes through the second lens. A fifth image is formed by modulating a size of the fourth image that passes through the third lens, and the fifth image is outputted from the RIB module.

According to another embodiment of the present invention, a lithographic system is provided. The lithographic system includes a light source, a condenser lens, a pattern formation part, an objective lens, and the abovementioned RIB module. The light source is used for providing an illumination beam, and the condenser lens is used for condensing the illumination beam. The pattern formation part is used for supporting a photomask, wherein the photomask is used for receiving the illumination beam condensed by the condenser lens, and a first image having a light intensity distribution is formed after the illumination beam passes through the photomask. The objective lens is used for receiving the first image, wherein the objective lens adjusts and outputs the first image. The first image is delivered to the RIB module by the objective lens, the RIB module further outputs the fifth image and projects the fifth image onto a substrate, and the RIB module is disposed between the objective lens and the substrate.

According to another embodiment of the present invention, a method of reconfiguring image brightness including following steps is provided. First, a device layout is provided, wherein the device layout includes a hotspot location data. Next, an illumination beam is provided by a light source. Then, a photomask including the device layout is provided, the photomask is used such that a first image having a light intensity distribution is formed from the illumination beam after the illumination beam passes through the photomask. Next, a RIB module including a switch and a DMD is provided, wherein the first image passes through the switch first, and a second image is imaged on a surface of the DMD next, wherein the DMD includes a plurality of micro mirrors arranged in a matrix, and the second image is divided into a plurality of sub-images by the micro mirrors. Then, the RIB module is used for controlling the micro mirrors to have non-identical tilt angles during an operation period of the DMD according to the hotspot location data, so as to form a third image having a reconfigured light intensity distribution and output the third image to a target.

These and other objectives of the present invention will no doubt become obvious to those of ordinary skill in the art

DETAILED DESCRIPTION

To provide a better understanding of the present invention, preferred embodiments will be detailed as follows. The preferred embodiments of the present invention are illustrated in the accompanying drawings with numbered elements to elaborate the contents and effects to be achieved. It is noted that, for purposes of illustrative clarity and being easily understood by the readers, the various features illustrated in various drawings may not be drawn to scale, and the dimension or scale of each device shown in drawings are only illustrative and are not intended to limit the scope of the present invention.

Figure 1:
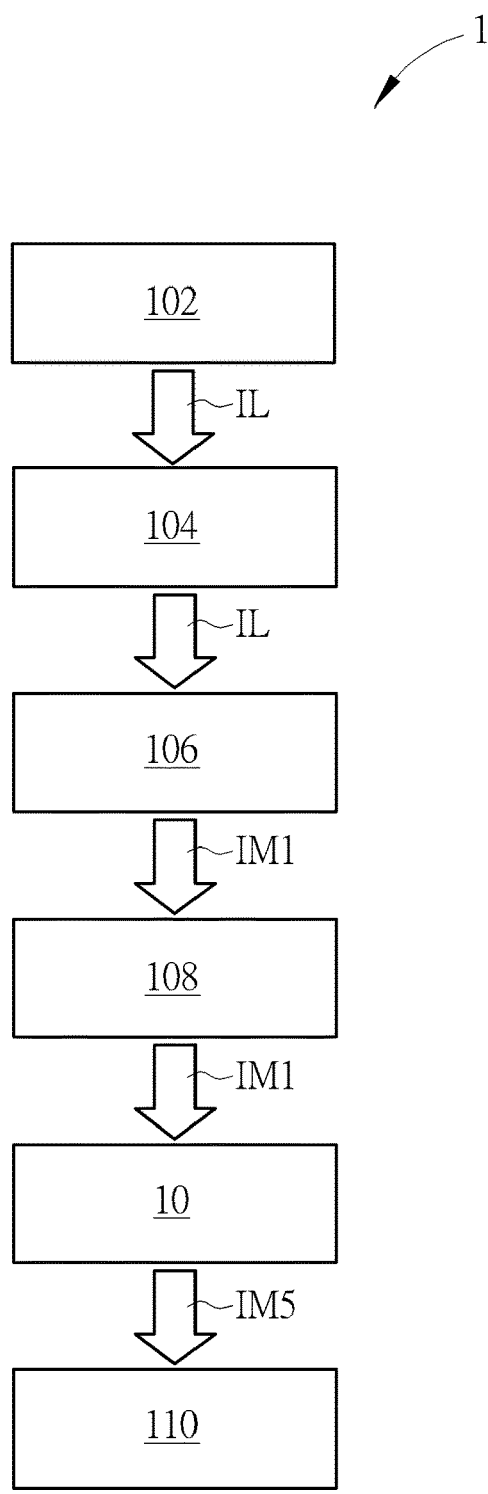
FIG. 1 is a functional block diagram illustrating a lithographic system according to an embodiment of the present invention.
Figure 2:
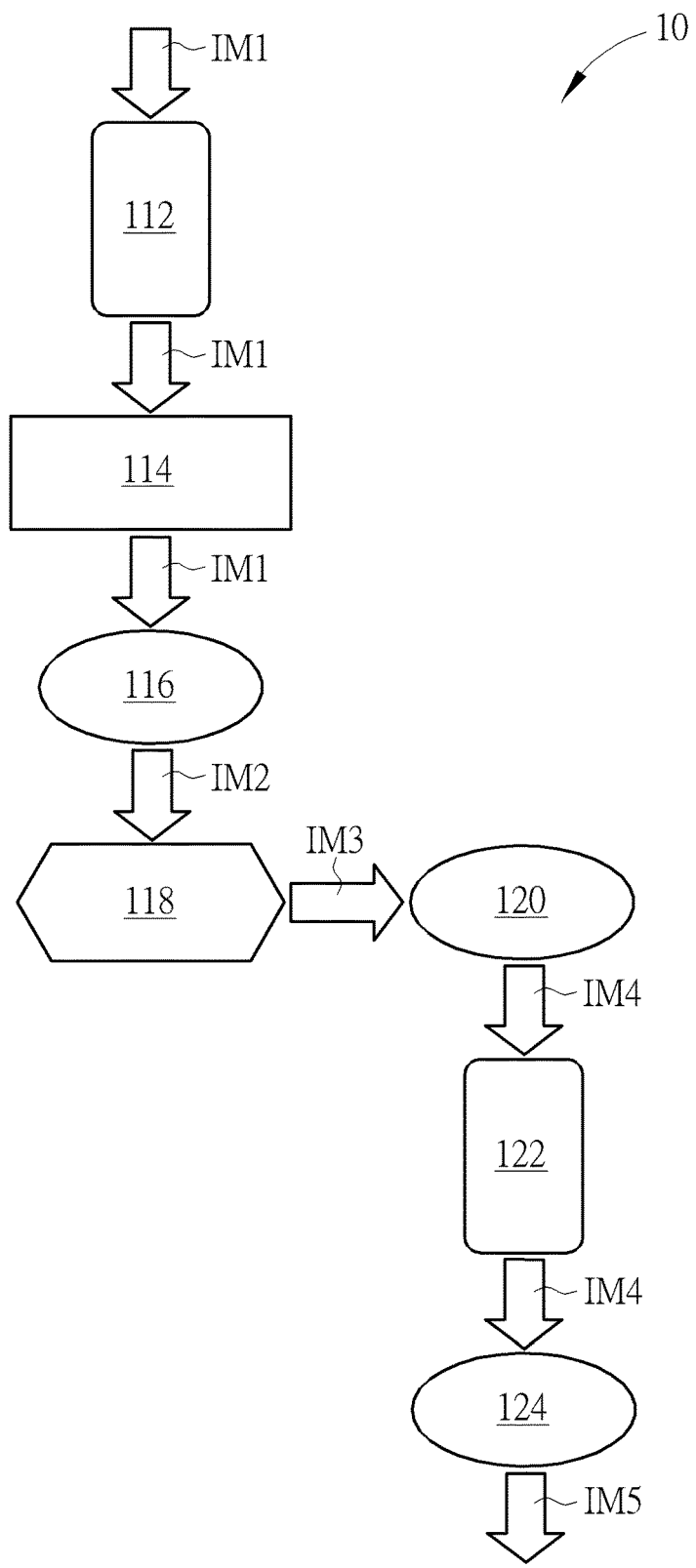
FIG. 2 is a functional block diagram illustrating a reconfiguring image brightness module according to the embodiment of the present invention.
Figure 3:
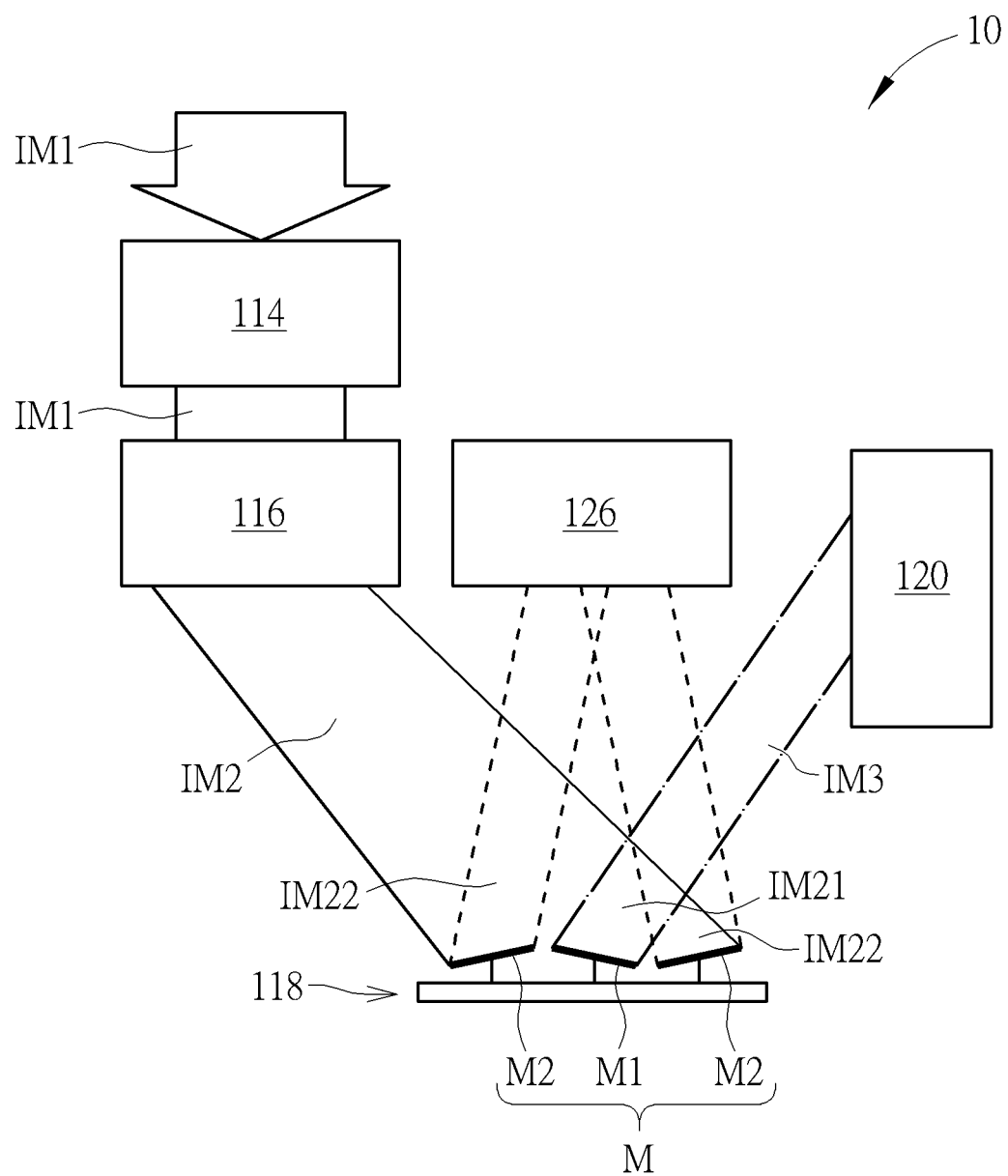
FIG. 3 is a schematic diagram illustrating the operation of the reconfiguring image brightness module according to the embodiment of the present invention in FIG. 2.
Figure 4:
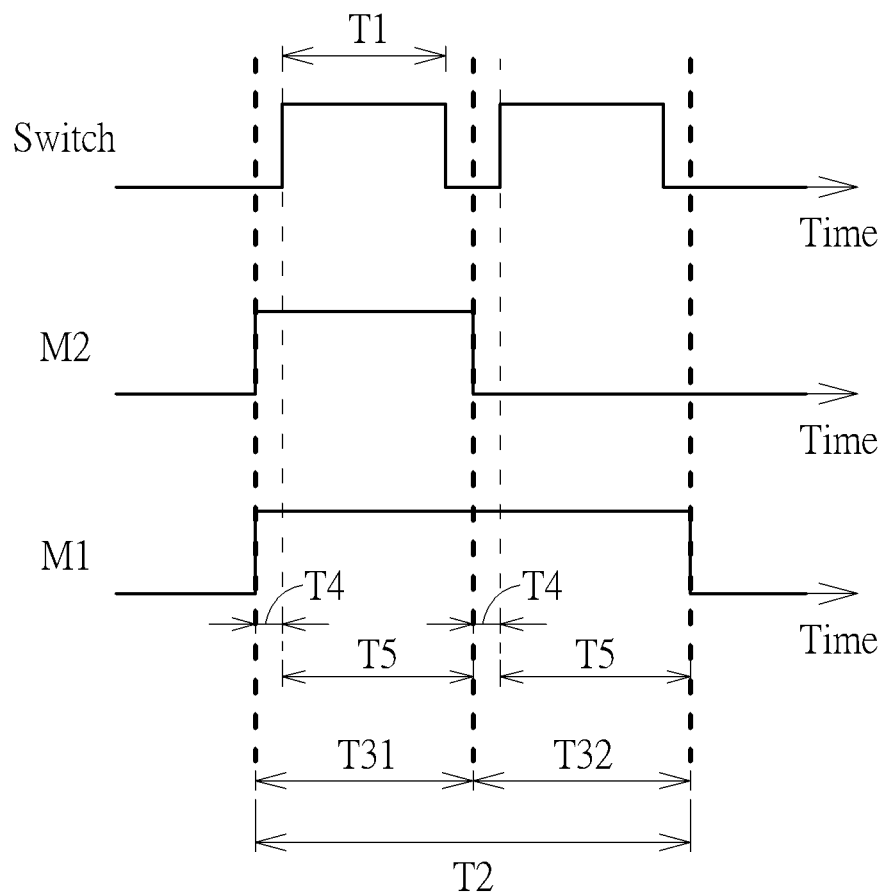
FIG. 4 is a schematic diagram illustrating an operation period of a digital micro-mirror device and light beam input periods of a switch of the embodiment according to the present invention.
Figure 5:
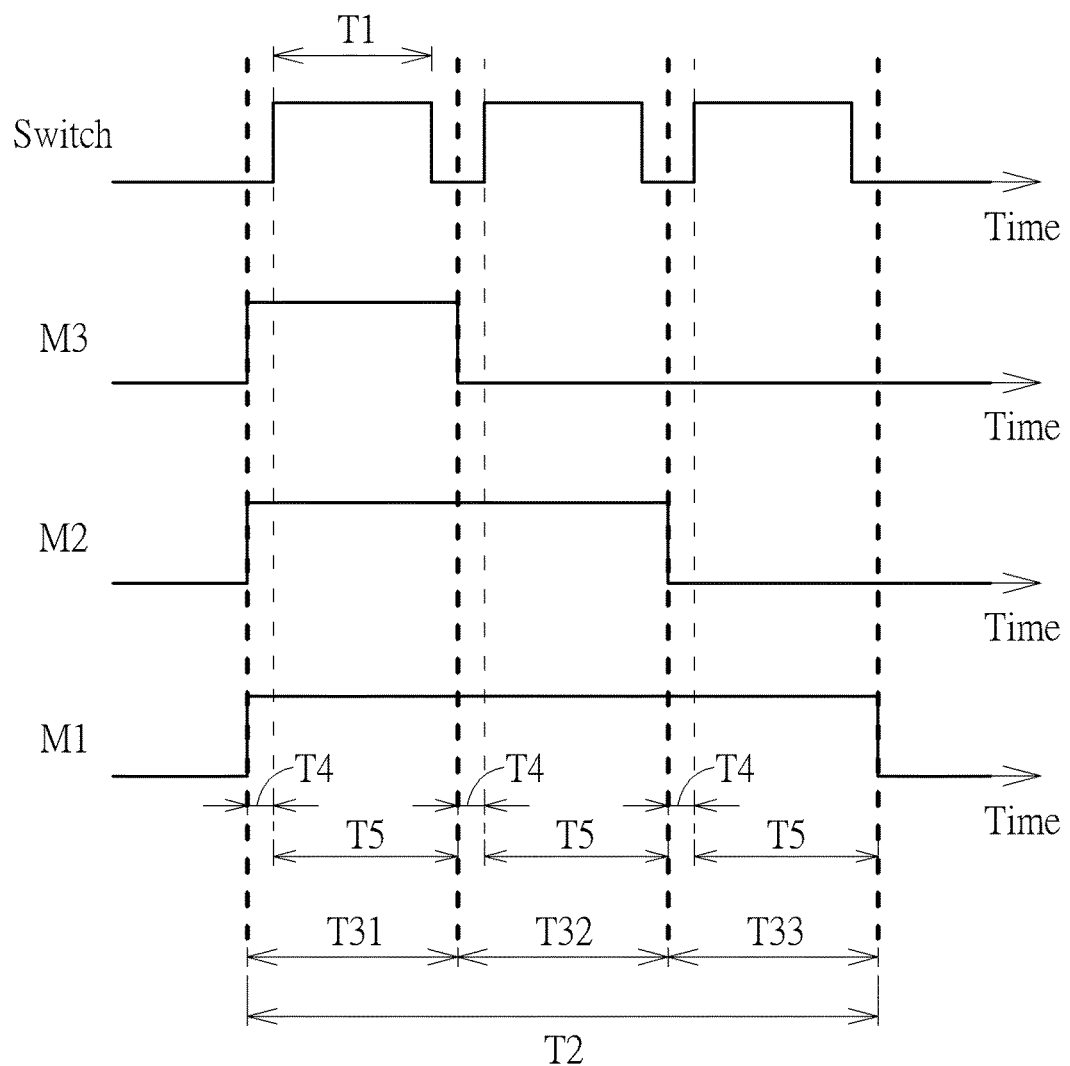
FIG. 5 is a schematic diagram illustrating an operation period of a digital micro-mirror device and light beam input periods of a switch of a variant embodiment according to the present invention.
Figure 6:
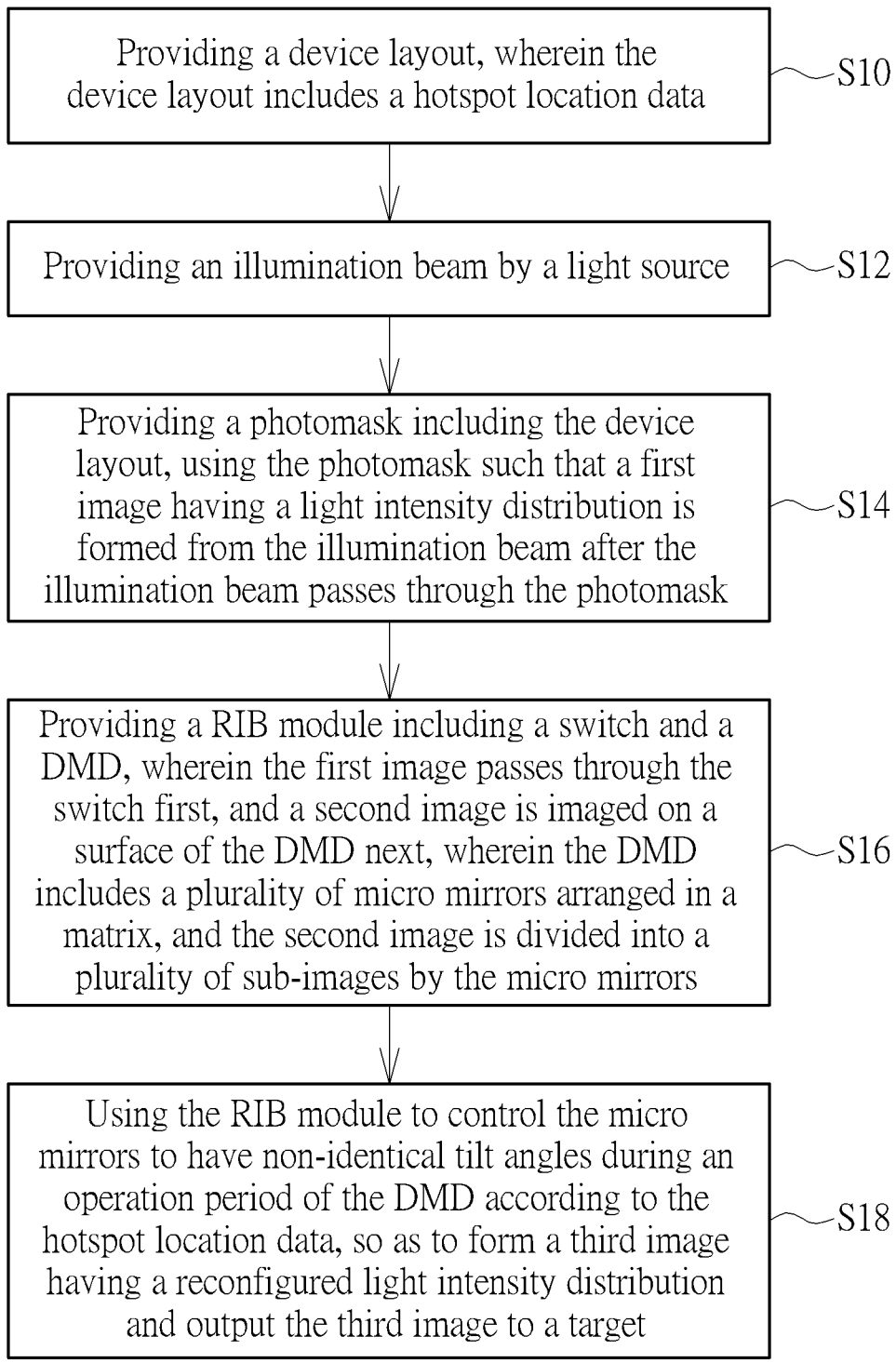
FIG. 6 is a schematic diagram illustrating a process flow of a method of reconfiguring image brightness according to the embodiment of the present invention.
Figure 7:
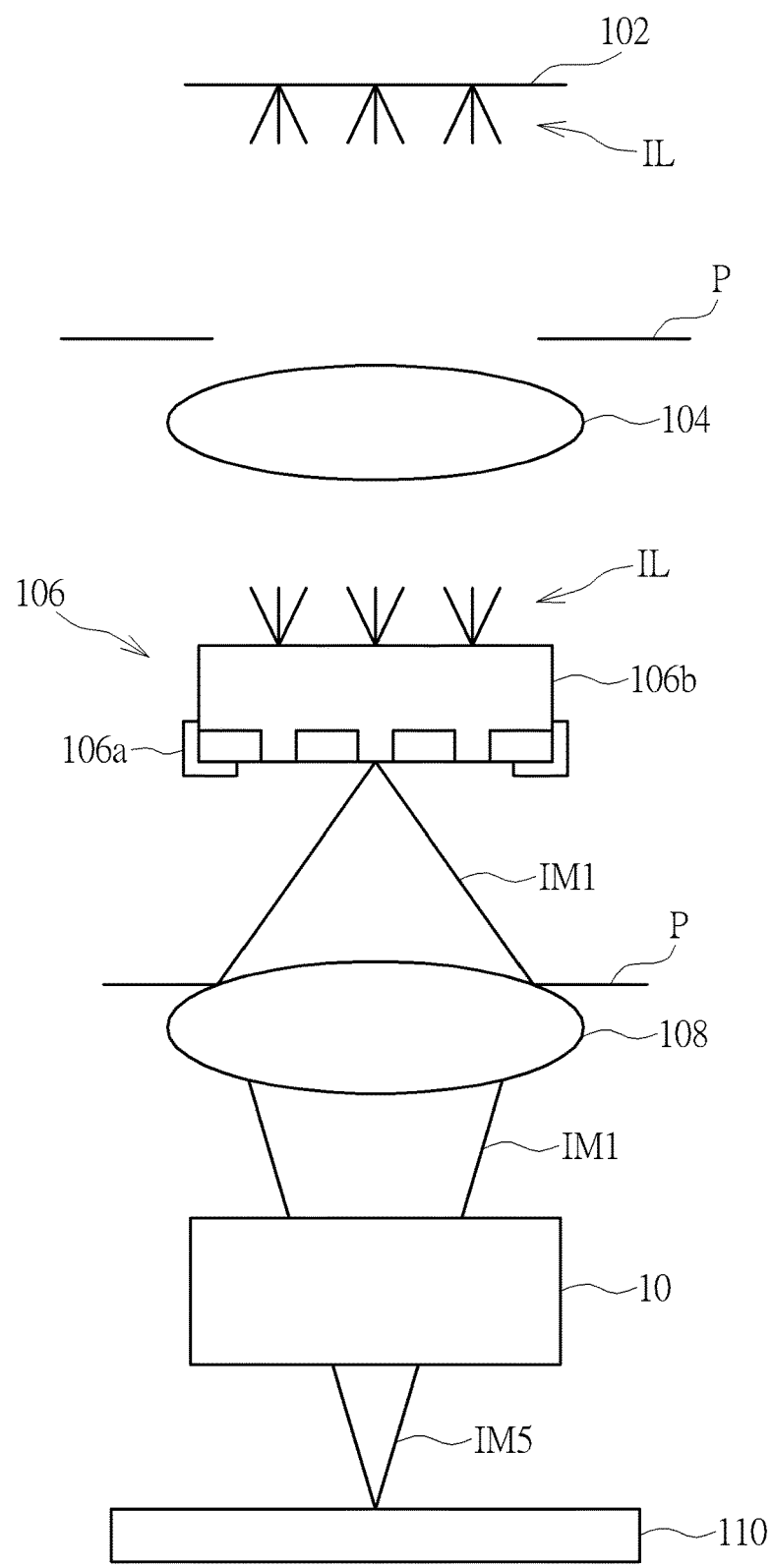
FIG. 7 is a schematic diagram illustrating the lithographic system according to the embodiment of the present invention.

Referring to FIG. 1 to FIG. 7, FIG. 1 is a functional block diagram illustrating a lithographic system according to an embodiment of the present invention, FIG. 2 is a functional block diagram illustrating a reconfiguring image brightness module according to the embodiment of the present invention, FIG. 3 is a schematic diagram illustrating the operation of the reconfiguring image brightness module according to the embodiment of the present invention in FIG. 2, FIG. 4 is a schematic diagram illustrating an operation period of a digital micro-mirror device and light beam input periods of a switch according to the embodiment of the present invention, FIG. 5 is a schematic diagram illustrating an operation period of a digital micro-mirror device and light beam input periods of a switch according to a variant embodiment of the present invention, FIG. 6 is a schematic diagram illustrating a process flow of a method of reconfiguring image brightness according to the embodiment of the present invention, and FIG. 7 is a schematic diagram illustrating the lithographic system according to the embodiment of the present invention. As shown in FIG. 1 and FIG. 7, a lithographic system 1 of this embodiment includes a light source 102, a condenser lens 104, a pattern formation part 106, an objective lens 108, and a reconfiguring image brightness module 10 (referred to as RIB module hereinafter). The light source 102 is used for providing an illumination beam IL, wherein the light source 102 can include laser or mercury lamp, and the illumination beam IL can include ultraviolet (UV) light beam, extreme ultraviolet (EUV) light beam, ion beam or electron beam, but not limited thereto. The condenser lens 104 is disposed in the light path of the illumination beam IL, so as to receive the illumination beam IL emitted from the light source 102. The illumination beam IL is condensed after passing through the condenser lens 104. In the light path of the illumination beam IL, the pattern formation part 106 is disposed after the condenser lens 104, and the condenser lens 104 is disposed between the light source 102 and the pattern formation part 106. The pattern formation part 106 can be used for supporting a photomask 106b, the photomask 106b is used for receiving the illumination beam IL condensed by the condenser lens 104, and a first image IM1 having a light intensity distribution is formed after the illumination beam IL passes through the photomask 106b disposed in the pattern formation part 106. For example, the pattern formation part 106 of this embodiment includes a support device 106a used for carrying and fixing the photomask 106b, so that the illumination beam IL can pass through the photomask 106b. The photomask 106b includes a device layout, and the first image IM1 having the light intensity distribution that is corresponded to the device layout can be formed after the illumination beam IL passes through the photomask 106b. The aforementioned support device 106a can include a frame or a table, but not limited thereto. The support device 106a can be fixed or moveable as required in order to ensure the photomask 106b is disposed in a suitable position. The photomask 106b can include a binary photomask, an alternating phase-shift photomask, an attenuated phase-shift photomask or other types of hybrid photomasks, but not limited thereto.

The objective lens 108 is disposed after the pattern formation part 106 in the light path for receiving the first image IM1. The objective lens 108 can adjust the focal length or the size (may be a length, a width or an area of an image) of the first image IM1 and outputs the adjusted first image IM1 again. For example, the first image IM1 may diverge when the first image IM1 is away from the pattern formation part 106, the diverged first image IM1 is converged again by the objective lens 108 in this embodiment, and the adjusted first image IM1 further proceeds to the RIB module 10. Accordingly, the objective lens 108 is disposed between the pattern formation part 106 and the RIB module 10 in the light path, the first image IM1 passes through the objective lens 108 first, and enters the RIB module 10 later. The condenser lens 104 and the objective lens 108 of this embodiment can include optical devices that are capable of performing optical beam shaping. For example, the condenser lens 104 and the objective lens 108 can respectively include a single convex lens, but not limited thereto. In other embodiments, the condenser lens 104 or the objective lens 108 may also include a combination of plural lenses.

As shown in FIG. 2 and FIG. 3, the RIB module 10 of this embodiment includes a first light guiding system 112, a switch 114, a first lens 116, a digital micro-mirror device 118 (referred to as DMD hereinafter), a second lens 120, a second light guiding system 122, and a third lens 124 and may optionally include an absorber 126. When the first image IM1 adjusted by the objective lens 108 transmits to the RIB module 10, the first image IM1 is guided to the switch 114 by the first light guiding system 112 first, and the switch 114 can selectively allow the first image IM1 to pass later. A second image IM2 can be formed by modulating the size of the first image IM1 that passes through the first lens 116 as the switch 114 allows the first image IM1 to pass. For example, the second image IM2 can be formed by enlarging the first image IM1 that passes through the first lens 116. The DMD 118 includes a plurality of micro mirrors M arranged in a matrix, wherein three micro mirrors M are shown in FIG. 3 for illustration, but the number of the micro mirrors M is not limited thereto. The micro mirrors M can respectively have independent tilt angles adjusted by a control unit (not shown in FIG. 2 and FIG. 3) when the DMD 118 operates. In this embodiment, the second image IM2 is imaged on a surface of the DMD 118, wherein different portions of the second image IM2 can be reflected at different angles by the micro mirrors M according to the adjustment of the tilt angles of the micro mirrors M. Therefore, the DMD 118 is capable of forming a third image IM3 having a reconfigured light intensity distribution and further outputting the third image IM3 to the second lens 120.

Specifically, the second image IM2 is divided into a plurality of sub-images by the micro mirrors M. For example, the second image IM2 is divided into a plurality of first sub-images IM21 and a plurality of second sub-images IM22, wherein the first sub-images IM21 correspond to one or several micro mirrors M1 of a first portion of micro mirrors M, and the second sub-images IM22 correspond to one or several micro mirrors M2 of a second portion of micro mirrors M. For simplicity and clarity, in FIG. 3, only one first sub-image IM21 and one micro mirror M1 corresponding thereto are illustrated, and two second sub-images IM22 and two micro mirrors M2 corresponding thereto are illustrate. In an operation period of the DMD 118, the micro mirrors M2 of the second portion change the tilt angles. At the end of the operation period, the tilt angles of the micro mirrors M1 of the first portion are different from the tilt angles of the micro mirrors M2 of the second portion. At this time, the micro mirrors M1 of the first portion reflect the first sub-images IM21 to the second lens 120, and the micro mirrors M2 of the second portion reflect the second sub-images IM22 out of the second lens 120. In this embodiment, the micro mirrors M2 of the second portion reflect the second sub-images IM22 to the absorber 126. Accordingly, the DMD 118 can complete outputting the third image IM3 to the second lens 120 after the operation period. In this embodiment, the absorber 126 is disposed above the DMD 118, and the second lens 120 is disposed at one side of the DMD 118. The control unit can control the micro mirrors M1 of the first portion and the micro mirrors M2 of the second portion to have suitable tilt angles, so that the second image IM2 imaged on the surface of the RIB module 118 can be partially or entirely reflected to the second lens 120 to reconfigure the light intensity distribution. For example, during the operation period of the RIB module 118, the micro mirrors M1 of the first portion and the micro mirrors M2 of the second portion are configured to respectively reflect the first sub-images IM21 and the second sub-images IM22 to the second lens 120 first. Next, in the later stage of the operation period, the micro mirrors M2 of the second portion are adjusted to reflect the second sub-images IM22 to the absorber 126. It is noteworthy that the relative position between the absorber 126, the second lens 120, and the DMD 118 is not limited to this embodiment.

In this embodiment, the third image IM3 is outputted to the second lens 120 by the DMD 118, and the third image IM3 passes through the second lens 120 and a size of the third image IM3 is modulated by the second lens 120 to form a fourth image IM4. For example, the third image IM3 is shrunk to form the fourth image IM4 by passing through the second lens 120. The second light guiding system 122 is disposed between the second lens 120 and the third lens 124, and the fourth image IM4 is guided to the third lens 124 by the second light guiding system 122. A fifth image IM5 is formed by modulating a size of the fourth image IM4 that passes through the third lens 124, and the fifth image IM5 is outputted from the RIB module 10. In this embodiment, the first light guiding system 112 (not shown in FIG. 3), the switch 114, and the first lens 116 can be disposed at one side of the DMD 118. The second lens 120, the second light guiding system 122 (not shown in FIG. 3), and the third lens 124 (not shown in FIG. 3) can be disposed at another side of the DMD 118, and the absorber 126 can be disposed above the DMD 118. However, positions of the devices in the RIB module 10 are not limited to the description in this embodiment. The first light guiding system 112 and the second light guiding system 122 are optionally included in the RIB module 10 and can respectively include one or more light reflecting or light refracting optical devices, such as lenses or mirrors. The first light guiding system 112 and the second light guiding system 122 are capable of guiding light beams by the combination of the optical devices described above. In addition, the first lens 116, the second lens 120, and the third lens 124 can include one or more different types of lenses, so that the first lens 116, the second lens 120, and the third lens 124 are capable of guiding, shaping, or controlling light beams.

As shown in FIG. 1 and FIG. 7, the RIB module 10 of this embodiment is disposed between the objective lens 108 and a substrate 110 used as an imaging target, and the fifth image IM5 outputted by the RIB module 10 is projected on the substrate 110. The substrate 110 can include a rigid substrate such as a silicon wafer or include a flexible substrate such as a plastic substrate, but not limited thereto. In addition, the substrate 110 may be disposed on a wafer stage (not shown in figures) for example, and the fifth image IM5 is capable of being imaged on a surface of the substrate 110. For instance, a photosensitive material layer (such as a photoresist) can be formed on the surface of the substrate 110. The material characteristics of the photosensitive material layer can be changed according to the light intensity distribution of the fifth image IM5 after the photosensitive material layer is exposed to the fifth image IM5. The device layout can further be obtained by performing a developing process to the photosensitive material layer. In addition, the light intensity distributions of the fifth image IM5 and the first image IM1 are different due to the reconfiguration of the light intensity distribution performed by the RIB module 10. The lithographic system 1 of this embodiment can optionally include one or more pupils P in order to allow the light beams to pass the lens and block other light beams that transmit in undesired directions. For example, the lithographic system 1 of this embodiment includes two pupils P, wherein one of the pupils P is disposed adjoining to one side of the condenser lens 104 that is close to the light source 102, and another one of the pupils P is disposed adjoining to one side of the objective lens 108 that is close to the pattern formation part 106.

A method of using the RIB module 10 to reconfigure image brightness of this embodiment is described herein in detail. Referring to FIG. 4 and refer to FIG. 1 to FIG. 3 and FIG. 7 together, FIG. 4 is a schematic diagram illustrating the operation period of the DMD and light beam input periods of the switch according to the embodiment of the present invention. First, the device layout is provided, and the device layout includes a hotspot location data. For example, the hotspot location data can be obtained by analyzing the device layout before the photolithography process is performed or during the designing of the photomask. Next, the illumination beam IL is provided by the light source 102, and the photomask 106b including the device layout is provided to the pattern formation part 106. The illumination beam IL passes through the photomask 106b to form the first image IM1 having the light intensity distribution, and the first image IM1 passes through the objective lens 108 and enters the RIB module 10. As shown in FIG. 4, the RIB module 10 can predetermine the number of light beam input periods T1 included in the exposure process and predetermine the number of operation cycles included in the operation period T2 of the DMD 118 according to various conditions (such as device layout, hotspot location data and so on) of the photolithography process. Additionally, the RIB module 10 turns on the switch 114 in the light beam input periods T1 to deliver the first image IM1 to pass the switch 114 and enter other devices in the RIB module 10. At the end of each of the light beam input periods T1, the RIB module 10 turns off the switch 114. The light beam input periods T1 are separated from each other and proceed sequentially. In the light beam input period T1, the first image IM1 passes through the switch 114 and the first lens 116 to form the second image IM2 first, the second image IM2 transmits to the surface of the DMD 118 next, and the second image IM2 is further divided into plural sub-images by the micro mirrors M. In another aspect, due to the predetermined settings of the RIB module 10 described above, the RIB module 10 controls the micro mirrors M to have different tilt angles in the operation period T2 of the DMD 118 according to the hotspot location data, so as to change the light intensity distribution of the first image IM1. Accordingly, the third image IM3 having the reconfigured light intensity distribution can be formed after the operation period T2, and the third image IM3 can be outputted to a target (such as the second lens 120). Specifically, the operation period T2 of the DMD 118 is greater than the light beam input period T1 of the switch 114. In this embodiment, one operation period T2 corresponds to two light beam input periods T1, wherein the operation period T2 includes at least one operation cycle, and each of the operation cycles corresponds to one of the light beam input periods T1. For example, the operation period T2 of this embodiment includes two operation cycles T31 and T32 that proceed in sequence as shown in FIG. 4, but not limited thereto. The operation cycles T31 and T32 respectively correspond to two light beam input periods T1 that proceed successively. For example, the operation cycle T31 overlaps one light beam input period T1 during a period of time, and the operation cycle T32 overlaps another light beam input period T1 during another period of time. Each of the operation cycles T31, T32 is greater than the light beam input period T1 corresponding thereto. In other words, only a portion of the operation cycle T31 or the operation cycle T32 overlaps the light beam input period T1 corresponding thereto.

In addition, each of the operation cycles T31, T32 includes an action section T4 and a retention section T5 in sequence. The tilt angles of a portion of the micro mirrors M are selectively adjusted in the action section T4. For example, only the tilt angles of a portion of the micro mirrors M are adjusted, and the tilt angles of another portion of the micro mirrors M are remain the same. It is noteworthy that the action section T4 in each of the operation cycles T31, T32 begins earlier than the light beam input periods T1 corresponding thereto. In other words, there is no light beam entering the DMD 118 when the micro mirrors M operate. Accordingly, the light beam can be prevented from being reflected to unnecessary locations when the tilt angles of the micro mirrors M are being adjusted, and a correct reconfigured light intensity distribution can therefore be obtained. The tilt angles of the micro mirrors M remain the same in the retention section T5, the retention section T5 and the corresponding light beam input periods T1 can begin at the same time, and the switch 114 turns on as the retention section T5 begins. In addition, the time duration of the retention section T5 is longer than that of the light beam input period T1 corresponding thereto, the corresponding light beam input period T1 ends earlier than the retention section T5, and the next operation cycle begins or the exposure process ends when the previous operation cycle has ended. Therefore, the light beam input period T1 of the previous operation cycle (such as T31) avoids overlapping the action section T4 of the subsequent operation cycle (such as T32) to obtain a correct reconfigured light intensity distribution. In addition, the time durations of the operation cycles T31, T32 in this embodiment are the same, but not limited thereto. In other embodiments, the time durations of the operation cycles T31, T32 can be different according to various requirements.

As shown in FIG. 3 and FIG. 4, in the action section T4 of $n^{th}$ numbered operation cycle T31 (n is a set of integers greater than 0, and n is 1 in this embodiment as an example), the tilt angles of the micro mirrors M1 that correspond to the first sub-images IM21 and the tilt angles of the micro mirrors M2 that correspond to the second sub-images IM22 are adjusted. After the adjustment, the micro mirrors M1 and the micro mirrors M2 can include the same tilt angle to reflect both the first sub-images IM21 and the second sub-images IM22 to the target (such as the second lens 120). In the action section T4 of $(n+1)^{th}$ numbered operation cycle T32 (the second operation cycle in this embodiment), the tilt angles of the micro mirrors M2 that correspond to the second sub-images IM22 is adjusted, and the tilt angles of the micro mirrors M1 that correspond to the first sub-images IM21 is kept the same (as shown in FIG. 4). After the adjustment, the micro mirrors M1 and the micro mirrors M2 can include different tilt angles. In the retention section T5 of the operation cycle T32, the first sub-images IM21 are reflected by the micro mirrors M1 corresponding thereto to the second lens 120, and the second sub-images IM22 are reflected by the micro mirrors M2 corresponding thereto to the absorber 126 outside the second lens 120. Accordingly, the DMD 118 provides the images having different light intensity distribution to the second lens 120 in the operation cycle T31 and the operation cycle T32 respectively. In other words, the light intensity distribution of the third image IM3 is different from that of the first image IM1 after the operation period T2, wherein the light intensity corresponding to first sub-images IM21 is greater than the light intensity corresponding to the second sub-images IM22 in the third image IM3. Therefore, a duration of the light beam illuminating a region of the substrate 110 corresponding to the first sub-image IM21 is longer than a duration of the light beam illuminating another region of the substrate 110 that corresponds to the second sub-image IM22 after the operation period T2. In another aspect, the photosensitive material layer on the substrate 110 can accumulate the energy of the incident light beam due to the characteristic of the photosensitive material. Therefore, an illumination dose (or light intensity) of the region corresponding to the first sub-image IM21 is higher than an illumination dose of the region corresponding to the second sub-image IM22. In general, the illumination light intensity nearby the location of the hotspot relates to the generation of the hotspot in the micro-photolithography process. For example, an ambit field having a 2 micrometers*2 micrometers area around the hotspot can be concerned. In short, the hotspot can be eliminated by adjusting the light intensity in the ambit field around the hotspot. In this embodiment, the size (such as area) of each micro mirror M is 2 micrometers*2 micrometers, but not limited thereto. Therefore, the illumination dose of the region of the substrate 110 can be adjusted by using the method of reconfiguring image brightness of this embodiment and referring to the hotspot location data, and the hotspot in the device layout can be eliminated.

In this embodiment, the RIB module 10 and the objective lens 108 can together be disposed on the same carrier stage, the carrier stage can move along a first direction and a second direction horizontally, and the first direction crosses the second direction. In other words, the DMD 118 can move along the first direction and the second direction horizontally, so as to compensate for the nonuniform brightness of the third image IM3 due to the slits between the micro mirrors M. In other embodiment, the RIB module 10 and the objective lens 108 may be disposed on different carrier stages.

Referring to FIG. 5, FIG. 5 is a schematic diagram illustrating an operation period of a digital micro-mirror device and light beam input periods of a switch according to a variant embodiment of the present invention. As shown in FIG. 5, in this variant embodiment, the operation period T2 of the DMD 118 corresponds to three light beam input periods T1, and the operation period T2 includes three operation cycles T31, T32, and T33 corresponding to three light beam input periods T1 respectively and sequentially. In this variant embodiment, the time durations of the operation cycles T31, T32, and T33 are the same, but not limited thereto. In other embodiments, the time durations of the operation cycles T31, T32, and T33 can be different according to various requirements. For example, the time duration of the operation cycle T31 can be shorter than that of the operation cycle T32, and the time duration of the operation cycle T32 can be shorter than that of the operation cycle T33. In addition, the second image is divided by the micro mirrors M1 of the first portion, the micro mirrors M2 of the second portion, and the micro mirrors M3 of a third portion into the first sub-images, the second sub-images, and the third sub-images. In the action section T4 of the first operation cycle T31, the tilt angles of the micro mirrors M1, the micro mirrors M2, and the micro mirrors M3 are adjusted. After the adjustment, the micro mirrors M1, the micro mirrors M2, and the micro mirrors M3 can include the same (or not exactly the same) tilt angle, so as to reflect all the first sub-images, the second sub-images, and the third sub-images to the target (such as the second lens 120). In the action section T4 of the second operation cycle T32, the tilt angles of the micro mirrors M3 that correspond to the third sub-images are adjusted, and the tilt angles of the micro mirrors M1 that correspond to the first sub-images and the tilt angles of the micro mirrors M2 that correspond to the second sub-images are kept the same. After the adjustment, the micro mirrors M1 and the micro mirrors M2 can include the same (or not exactly the same) tilt angle, the micro mirrors M3 can include the tilt angles that are different from that of the micro mirrors M1 and the micro mirrors M2. In other words, the tilt angles of the micro mirrors M3 and the tilt angles of the micro mirrors M1 and the micro mirrors M2 can have an apparent difference. Accordingly, in the retention section T5 of the operation cycle T32, the first sub-images and the second sub-images are reflected by the micro mirrors M1 and the micro mirrors M2 corresponding thereto to the second lens 120, and third sub-images are reflected by the micro mirrors M3 corresponding thereto to the absorber 126 outside the second lens 120. Next, in the action section T4 of the third operation cycle T33, the tilt angles of the micro mirrors M2 that correspond to the second sub-images are adjusted, and the tilt angles of the micro mirrors M1 and the micro mirrors M3 that correspond to the first sub-images and the third sub-images are kept the same. After the adjustment, the micro mirrors M2 and the micro mirrors M3 can include approximately or substantially the same tilt angle, and the tilt angles of the micro mirrors M2 and the micro mirrors M3 are different from the tilt angles of the micro mirrors M1. Accordingly, in the retention section T5 of the operation cycle T33, the first sub-images are still reflected by the micro mirrors M1 corresponding thereto to the second lens 120, and the second sub-images and the third sub-images are reflected by the micro mirrors M2 and the micro mirrors M3 corresponding thereto to the absorber 126 outside the second lens 120. Therefore, the DMD 118 respectively provides images having different light intensity distributions to the second lens 120 from the operation cycle T31 to the operation cycle T33. In other words, the light intensity distribution of the third image IM3 is different from that of the first image IM1 after the operation period T2. In addition, at least three different regions of the substrate 110 are illuminated by different illumination doses after the operation period T2. The aforementioned embodiment and this variant embodiment are examples according to the basic principle of the method of reconfiguring image brightness of the present invention. The method of reconfiguring image brightness can be adjusted according to different device layouts by following the principle of the present invention.

In short, the method of reconfiguring image brightness of the present invention mainly includes the steps shown in FIG. 6:

step S10: Providing a device layout, wherein the device layout includes a hotspot location data;

step S12: Providing an illumination beam by a light source;

step S14: Providing a photomask including the device layout, using the photomask such that a first image having a light intensity distribution is formed from the illumination beam after the illumination beam passes through the photomask;

step S16: Providing a RIB module including a switch and a DMD, wherein the first image passes through the switch first, and a second image is imaged on a surface of the DMD next, wherein the DMD includes a plurality of micro mirrors arranged in a matrix, and the second image is divided into a plurality of sub-images by the micro mirrors; and step S18: Using the RIB module to control the micro mirrors to have non-identical tilt angles during an operation period of the DMD according to the hotspot location data, so as to form a third image having a reconfigured light intensity distribution and output the third image to a target.

To sum up, the RIB module of the present invention includes the DMD including the micro mirrors arranged in a matrix to divide the image having the device layout into plural sub-images. In addition, the lithography hotspots can be avoided by adjusting the illumination dose of the ambit field in the vicinity thereof. The size of each of the micro mirrors is equal to the size of the ambient field in this invention. The sub-image corresponding to the hotspot that may occur can be obtained by the hotspot location data related to the device layout. The time duration of reflecting the light beam and the angle of the micro mirror corresponding to such sub-image can be adjusted, so that the region of the substrate corresponding to such sub-image can receive an illumination dose that is different from other regions of the substrate. Comparing to the convention method of forming the image by the photomask and the objective lens, the RIB module of the present invention can further form another image having the reconfigured light intensity distribution on the substrate. Accordingly, the light intensity of the regions of the substrate can be adjusted to form a correct and precise pattern on the substrate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A reconfiguring image brightness (RIB) module, comprising:
    a switch that selectively allows a first image having a light intensity distribution to pass, wherein the first image having the light intensity distribution is formed after an illumination beam passes through a photomask;
    a first lens, wherein the first lens outputs a second image by modulating a size of the first image that passes through the first lens;
    a digital micro-mirror device (DMD), wherein the second image is imaged on a surface of the DMD, and a third image having a reconfigured light intensity distribution is formed by the DMD;
    a second lens, wherein the third image is outputted to the second lens by the DMD, and the second lens outputs a fourth image by modulating a size of the third image that passes through the second lens; and
    a third lens, wherein a fifth image is formed by modulating a size of the fourth image that passes through the third lens, and the fifth image is outputted from the RIB module.

2. The RIB module according to claim 1, further comprising a first light guiding system and a second light guiding system, wherein the first image is guided to the switch by the first light guiding system, the second light guiding system is disposed between the second lens and the third lens, and the fourth image is guided to the third lens by the second light guiding system.

3. The RIB module according to claim 1, wherein the switch and the first lens are disposed at one side of the DMD, and the second lens is disposed at another side of the DMD.

4. The RIB module according to claim 1, wherein the DMD comprises a plurality of micro mirrors arranged in a matrix, and the micro mirrors respectively have independent tilt angles when the DMD operates.

5. The RIB module according to claim 4, wherein the second image imaged on the surface of the DMD is divided into a plurality of first sub-images and a plurality of second sub-images by the micro mirrors, the first sub-images correspond to a first portion of the micro mirrors respectively, the second sub-images correspond to a second portion of the micro mirrors respectively, the DMD outputs the third image to the second lens after an operation period of the DMD, the tilt angles of the second portion of the micro mirrors are changed during the operation period, and the tilt angles of the first portion of the micro mirrors are different from the tilt angles of the second portion of the micro mirrors at the end of the operation period.

6. The RIB module according to claim 5, wherein at the end of the operation period, the first portion of the micro mirrors reflects the first sub-images to the second lens, and the second portion of the micro mirrors reflects the second sub-images out of the second lens.

7. The RIB module according to claim 1, further comprising an absorber, wherein the DMD reflects a portion of light to the absorber for reconfiguring the light intensity distribution while the DMD forms the third image having the reconfigured light intensity distribution.

8. The RIB module according to claim 7, wherein the absorber is disposed above the DMD.

9. The RIB module according to claim 1, wherein the DMD is capable of moving along a first direction and a second direction horizontally, and the first direction crosses the second direction.

10. The RIB module according to claim 1, wherein the first image is enlarged to form the second image by passing through the first lens, the third image is shrank to form the fourth image bypassing through the second lens, and the fourth image is enlarged to form the fifth image by passing through the third lens.

11. A lithographic system, comprising:
    a light source used for providing an illumination beam;
    a condenser lens used for condensing the illumination beam;
    a pattern formation part used for supporting a photomask, wherein the photomask is used for receiving the illumination beam condensed by the condenser lens, and a first image having a light intensity distribution is formed after the illumination beam passes through the photomask;
    an objective lens used for receiving the first image, wherein the objective lens adjusts and outputs the first image; and
    the RIB module according to claim 1, wherein the first image is delivered to the RIB module by the objective lens, the RIB module further outputs the fifth image and projects the fifth image onto a substrate, and the RIB module is disposed between the objective lens and the substrate.

12. A method of reconfiguring image brightness, comprising:
    providing a device layout, wherein the device layout comprises a hotspot location data;
    providing an illumination beam by a light source;
    providing a photomask comprising the device layout, using the photomask such that a first image having a light intensity distribution is formed from the illumination beam after the illumination beam passes through the photomask;
    providing a RIB module comprising a switch and a DMD, wherein the first image passes through the switch first, and a second image is imaged on a surface of the DMD next, wherein the DMD comprises a plurality of micro mirrors arranged in a matrix, and the second image is divided into a plurality of sub-images by the micro mirrors; and
    using the RIB module to control the micro mirrors to have non-identical tilt angles during an operation period of the DMD according to the hotspot location data, so as to form a third image having a reconfigured light intensity distribution and output the third image to a target.

13. The method of reconfiguring image brightness according to claim 12, further comprising turning on the switch in a plurality of light beam input periods, so as to deliver the first image into the RIB module, and turning off the switch at the end of each of the light beam input periods, wherein the light beam input periods are spaced from each other and proceed sequentially, the operation period is greater than the light beam input periods and comprises at least one operation cycle, wherein the operation cycle corresponds to one of the light beam input periods.

14. The method of reconfiguring image brightness according to claim 13, wherein the operation cycle comprises an action section and a retention section in sequence, the tilt angles of a portion of the micro mirrors are selectively adjusted in the action section, and the tilt angles of the micro mirrors remain the same in the retention section, wherein the action section begins earlier than the light beam input period corresponding thereto, the retention section overlaps the light beam input period corresponding thereto, and the corresponding light beam input period ends earlier than the retention section.

15. The method of reconfiguring image brightness according to claim 14, wherein the operation period of the DMD comprises a plurality of operation cycles that proceed in sequence in the operation period, and each of the operation cycles corresponds to one of the light beam input periods.

16. The method of reconfiguring image brightness according to claim 15, wherein the sub-images comprise a plurality of first sub-images and a plurality of second sub-images, each of the first sub-images corresponds to one of the micro mirrors, each of the second sub-images corresponds to another one of the micro mirrors, and the method further comprises:

in the action section of $n^{th}$ numbered operation cycle of the operation cycles, adjusting the tilt angles of the micro mirrors that correspond to the first sub-images and adjusting the tilt angles of the micro mirrors that correspond to the second sub-images, wherein n is a set of integers greater than 0; and in the action section of $(n+1)^{th}$ numbered operation cycle of the operation cycles, adjusting the tilt angles of the micro mirrors that correspond to the second sub-images, and keeping the tilt angles of the micro mirrors that correspond to the first sub-images the same, so as to reflect the first sub-images to the target by the micro mirrors corresponding to the first sub-images, and to reflect the second sub-images to an absorber outside the target by the micro mirrors corresponding to the second sub-images in the retention section of the $(n+1)^{th}$ numbered operation cycle.

17. The method of reconfiguring image brightness according to claim 12, further comprising:
using a first light guiding system to guide the first image to the switch; and
using a first lens to enlarge the first image to form the second image after the first image passes the switch.

18. The method of reconfiguring image brightness according to claim 12, further comprising:
using a second lens to shrink the third image to form a fourth image;
using a second light guiding system to guide the fourth image to a third lens;
using the third lens to enlarge the fourth image to form a fifth image, and outputting the fifth image from the RIB module; and
projecting the fifth image onto a substrate.

19. The method of reconfiguring image brightness according to claim 12, further comprising moving the DMD along a first direction and a second direction horizontally, wherein the first direction crosses the second direction.

20. The method of reconfiguring image brightness according to claim 12, further comprising analyzing the device layout to obtain the hotspot location data.

* * * * *